United States Patent
Sukegawa (10) Patent No.: US 8,098,927 B2
(45) Date of Patent: Jan. 17, 2012

(54) IMAGING CHARACTERISTICS FLUCTUATION PREDICTING METHOD, EXPOSURE APPARATUS, AND DEVICE MANUFACTURING METHOD

(75) Inventor: Takashi Sukegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 735 days.

(21) Appl. No.: 12/177,205

(22) Filed: Jul. 22, 2008

(65) Prior Publication Data

US 2009/0028421 A1    Jan. 29, 2009

(30) Foreign Application Priority Data

Jul. 26, 2007 (JP) .................. 2007-194793

(51) Int. Cl.
*G06K 9/36* (2006.01)
(52) U.S. Cl. ......... 382/145; 382/149; 382/144; 356/620
(58) Field of Classification Search .................. 382/145, 382/141, 149, 144; 355/55, 53, 67–71; 356/620, 356/624
See application file for complete search history.

(56) References Cited

U.S. PATENT DOCUMENTS

| 4,801,977 | A | * | 1/1989 | Ishizaka et al. | 355/30 |
| 4,908,656 | A | * | 3/1990 | Suwa et al. | 355/53 |
| 5,053,628 | A | * | 10/1991 | Yamamoto et al. | 250/557 |
| 5,661,546 | A | * | 8/1997 | Taniguchi | 355/53 |
| 5,680,200 | A | * | 10/1997 | Sugaya et al. | 355/53 |
| 5,917,581 | A | * | 6/1999 | Suzuki | 355/55 |
| 6,265,137 | B1 | * | 7/2001 | Hirukawa | 430/312 |
| 6,509,956 | B2 | * | 1/2003 | Kobayashi | 355/55 |
| 6,714,282 | B2 | * | 3/2004 | Inoue | 355/55 |

FOREIGN PATENT DOCUMENTS

| JP | 63-016725 A | 1/1988 |
| JP | 8-234138 A | 9/1996 |
| JP | 2004-327647 A | 11/2004 |
| JP | 2006-073584 A | 3/2006 |

* cited by examiner

*Primary Examiner* — Sang Nguyen
(74) *Attorney, Agent, or Firm* — Canon U.S.A., Inc. IP Division

(57) ABSTRACT

A method for predicting imaging characteristics fluctuation of a projection optical system in an exposure apparatus which projects a pattern formed on a mask onto a photosensitive substrate through the projection optical system is provided. In a measurement step, the projection optical system is irradiated with exposure light under a first exposure condition to measure first imaging characteristics fluctuation of the projection optical system. Then, before an imaging characteristics value is restored to an initial value at the start of irradiation after irradiation is stopped, the projection optical system is irradiated with the exposure light under a second exposure condition to measure second imaging characteristics fluctuation of the projection optical system. Approximate expressions of the measured first and second imaging characteristics fluctuations are calculated based on an imaging characteristics model.

5 Claims, 7 Drawing Sheets

IMAGING CHARACTERISTICS FLUCTUATION PREDICTING METHOD, EXPOSURE APPARATUS, AND DEVICE MANUFACTURING METHOD

BACKGROUND OF THE INVENTION

1. Field of the Invention

The present invention relates to an exposure apparatus to manufacture a device such as a semiconductor device or liquid crystal device.

2. Description of the Related Art

The process of manufacturing a semiconductor device formed of a micropattern such as LSIs or VLSIs employs a reduction projection exposure apparatus which reduces and exposes a circuit pattern formed on a mask (reticle) onto a substrate (wafer) coated with a photosensitive agent to form an exposed pattern.

As the integration density of the semiconductor device increases, further pattern miniaturization is required. Demands for a development in resist process as well as for miniaturization for the exposure apparatus are increasing simultaneously.

A method of improving the resolution of the exposure apparatus includes a method of changing an exposure wavelength to a shorter wavelength and a method of increasing the numerical aperture (NA) of a projection optical system. When the resolution is improved in this manner, the depth of focus of the projection optical system decreases. Hence, an increase in focus accuracy with which the wafer surface is matched with the imaging plane (focal plane) of the projection optical system is an important issue.

One of the important optical characteristics of the projection exposure apparatus is alignment accuracy with which the patterns in a plurality of steps are overlaid accurately. An important factor that influences the alignment accuracy includes a magnification error of the projection optical system. The pattern feature size of a VLSI shrinks every year, and accordingly a requirement for an improvement in alignment accuracy also increases. Hence, it is very important to maintain the magnification of the projection optical system at a predetermined value.

It is known that the projection optical system absorbs part of the exposure energy, and that a heat generated by the absorption changes the temperature of the projection optical system, which, in turn, changes the optical characteristics such as the refractive index of the projection optical system.

When the projection optical system is irradiated with exposure light over a long period of time, the imaging characteristics (focus, magnification, distortion, astigmatism aberration, wavefront aberration, and the like) of the projection optical system fluctuate. Consequently, non-negligible errors of focus and alignment as described above may undesirably occur.

In view of this, a method has been proposed which compensates for the fluctuation in imaging characteristics which occurs in the projection optical system depending upon the exposure energy irradiation state. For example, according to Japanese Patent Publication No. 63-16725 of the present applicant, the fluctuation amount of the imaging characteristics depending on the exposure energy state of the projection optical system is calculated by a model expression including the exposure amount, exposure time, non-exposure time, and the like as parameters, and the fluctuation in imaging characteristics of the projection optical system is corrected based on the calculation result.

The model expression described above has coefficients for the respective imaging characteristics specific to the projection optical system. The fluctuation of the imaging characteristics of the projection optical system can be obtained and corrected by setting the coefficients approximately.

An exposure apparatus has been proposed which can obtain a higher resolution for a specific projected pattern by changing the illumination shape. In this apparatus, the light source distribution formed on the pupil plane of the projection optical system changes depending on the exposure condition (the NA of the projection system, the numerical aperture of the illumination system, the exposure region, the exposure central position, the mask used for exposure, and the like). Accordingly, the fluctuation amount of the imaging characteristics for each exposure condition changes.

Hence, an exposure method has been proposed which adjusts the imaging characteristics fluctuation well even when the distribution of an energy incident on the projection optical system changes. For example, according to a method disclosed by Japanese Patent No. 2828226, the correction coefficient of the imaging characteristics corresponding to the light source distribution state of the illumination light is stored. When the light source distribution state is changed, corresponding correction information is read out, and the fluctuation is corrected based on the readout information.

To accurately correct the fluctuation of the imaging characteristics corresponding to the light source distribution state of the illumination light described above, a correction coefficient optimum for a given exposure condition must be calculated from a difference in light source distribution state of the illumination light on the pupil plane, reticle transmittance, exposure region, scanning speed, exposure amount, irradiation time, and the like.

As described above, a correction coefficient which is optimum for the exposure condition and serves to compensate for the fluctuation of the imaging characteristics must be calculated. As the miniaturization progresses, an improvement in accuracy is required of the exposure apparatus. To correct more accurately the fluctuation of the imaging characteristics occurring upon exposure is sought for.

The correction coefficient changes for each exposure condition, and it is difficult to completely suppress thermal fluctuation accompanying exposure. It requires a constant length of time or more to capture a thermal fluctuation phenomenon, and it requires much time to obtain correction coefficients for a plurality of exposure conditions.

Assume that correction coefficients for the respective exposure conditions are to be calculated separately. To eliminate the influence of exposure under each exposure condition, evaluation under the next exposure condition must be performed after the fluctuation of the imaging characteristics caused by exposure under a previous exposure condition almost disappears. This requires much time due to the characteristics of the thermal relaxation phenomenon.

SUMMARY OF THE INVENTION

It is, therefore, an object of the present invention to provide a method capable of efficiently predicting imaging characteristics fluctuation for each exposure condition.

According to the present invention, the foregoing object is attained by providing A method for predicting fluctuation in imaging characteristics of a projection optical system in an exposure apparatus which projects a pattern formed on a reticle onto a wafer through the projection optical system, the method comprises:

a measurement step of irradiating the projection optical system with exposure light under a first exposure condition to measure first imaging characteristics fluctuation of the projection optical system and, before an imaging characteristics value is restored to an initial value at the start of irradiation after irradiation is stopped, irradiating the projection optical system with the exposure light under a second exposure condition to measure second imaging characteristics fluctuation of the projection optical system; and a calculation step of calculating approximate expressions of the first and second imaging characteristics fluctuations measured in the measurement step based on an imaging characteristics model.

Further features of the present invention will become apparent from the following description of exemplary embodiments with reference to the attached drawings.

DESCRIPTION OF THE EMBODIMENTS

Various exemplary embodiments, features, and aspects of the present invention will be described in detail below with reference to the drawings.

Note that in this specification, the imaging characteristics include at least one of focus, magnification, distortion, astigmatism aberration, spherical aberration, coma aberration, and wavefront aberration. As is known well in this technical field, wavefront aberration is expressed as terms obtained by developing a wavefront shape as Zernike Polynomials. These imaging characteristics may be called "aberration" generically.

First Embodiment

Figure 1:
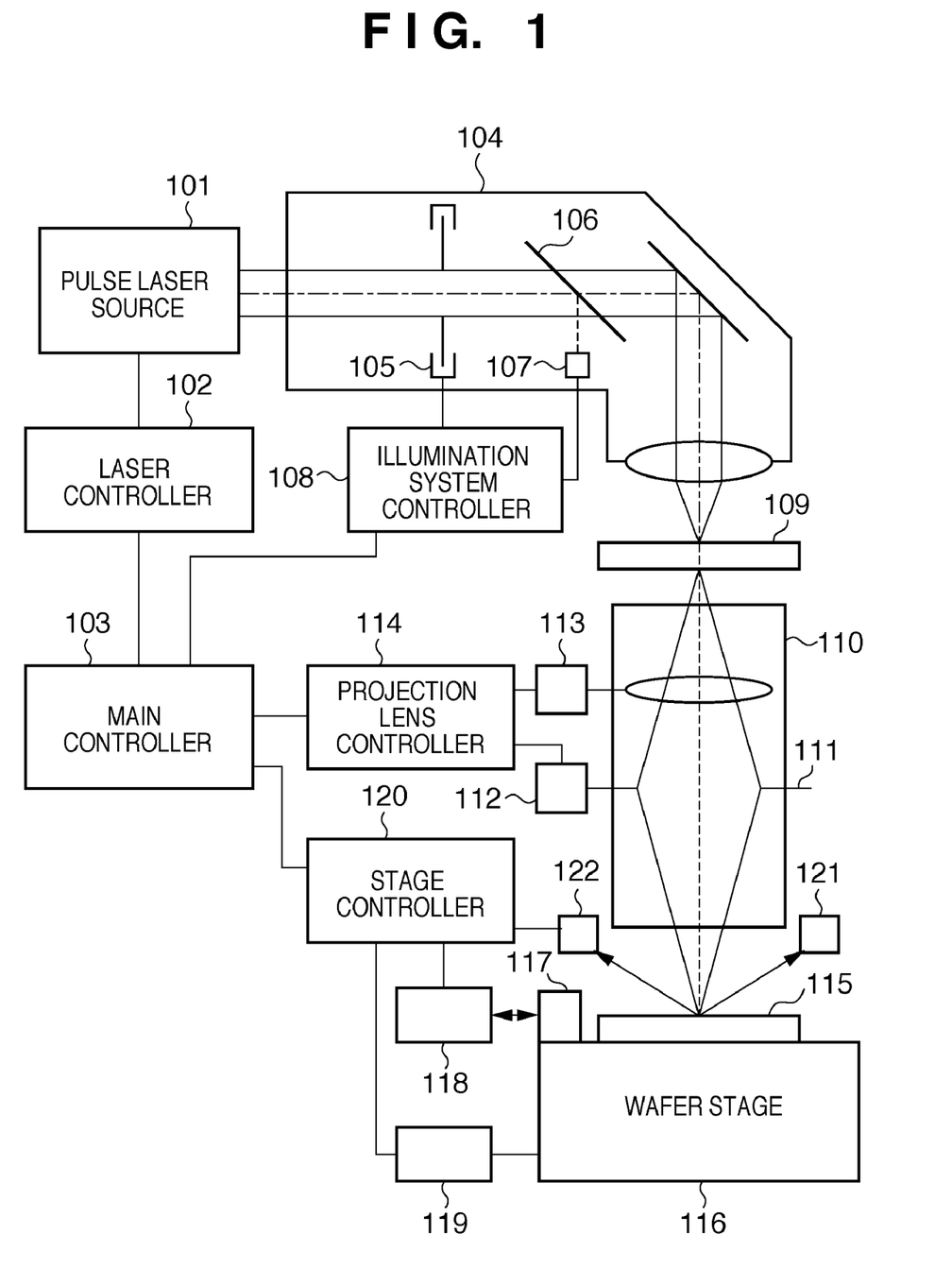
FIG. 1 is a view showing the schematic configuration of a scanning type exposure apparatus according to an embodiment.

FIG. 1 shows the schematic configuration of a scanning type exposure apparatus according to this embodiment. Referring to FIG. 1, reference numeral 101 denotes a pulse laser source in which a gas such as KrF or Ar is sealed to emit a laser.

The pulse laser source 101 emits light having a wavelength in a far ultraviolet region of, for example, 193 nm. The pulse laser source 101 includes a band narrowing module comprising a front mirror which constitutes a resonator, a diffraction grating to narrow the band of the exposure wavelength, a prism, and the like. The pulse laser source 101 also includes a monitor module comprising a spectroscope to monitor the stability and spectral bandwidth of the wavelength, a detector, and the like. The pulse laser source 101 is also provided with a shutter or the like.

A laser controller 102 controls the gas exchange operation, wavelength stabilization, discharge application voltage, and the like of the pulse laser source 101. In this embodiment, the pulse laser source 101 is not controlled by the single control operation of the laser controller 102, but can be controlled by an instruction from a main controller 103 of the entire exposure apparatus which is connected through an interface cable.

A beam emitted from the pulse laser source 101 is shaped into a predetermined beam shape through the beam shaping optical system (not shown) of an illumination optical system 104. The shaped beam is further incident on an optical integrator (not shown) and forms a large number of secondary light sources to illuminate a reticle 109 (to be described later) with a uniform illuminance distribution.

The aperture portion of an aperture stop 105 of the illumination optical system 104 is almost circular. An illumination system controller 108 can set the diameter of the aperture portion and accordingly the numerical aperture (NA) of the illumination optical system 104 to desired values. In this case, the value of the ratio of the numerical aperture of the illumination optical system 104 to that of a projection optical system 110 (to be described later) is a coherent factor ($\alpha$ value). Hence, the illumination system controller 108 can set the $\alpha$ value by controlling the aperture stop 105 of the illumination system.

A half mirror 106 is positioned on the optical path of the illumination optical system 104 and reflects and extracts part of the exposure light that illuminates the reticle 109. An ultraviolet light photosensor 107 is positioned on the optical path of the reflected light of the half mirror 106 and generates an output corresponding to the intensity (exposure energy) of the exposure light.

An integration circuit (not shown) which integrates each pulse light emitted by the pulse laser source 101 converts the output from the photosensor 107 into an exposure energy per pulse. The obtained exposure energy is input to the main controller 103, which controls the main body of the exposure apparatus, through the illumination system controller 108.

The reticle (or mask) 109 serves as an original. The circuit pattern of a semiconductor device to be exposed is formed on the reticle, and is irradiated by the illumination optical system 104. The projection optical system 110 is positioned to reduce the circuit pattern image of the reticle 109 with a reduction magnification $\beta$ (for example, $\beta=\frac{1}{4}$) and form an image by projection on one shot region of a wafer 115 serving as a photosensitive substrate coated with a photoresist.

An aperture stop 111, having an almost circular aperture portion, of the projection optical system 110 is positioned on the pupil plane (a Fourier transformation plane for the reticle) of the projection optical system 110. A driving unit 112 such as a motor controls the diameter of the aperture portion of the aperture stop 111, thereby setting the diameter to a desired value.

Reference numeral 113 denotes a field lens driver. The field lens driver 113 serves to move a field that constitutes part of the lens system in the projection optical system 110 along the optical axis of the projection optical system 110 by utilizing a pneumatic pressure, a piezoelectric element, or the like. This improves the projection magnification while preventing degradation in various aberrations of the projection optical system 110, thereby decreasing a distortion error.

Reference numeral 114 denotes a projection lens controller which controls the driving unit 112 and field lens driver 113 under the control of the main controller 103.

A wafer stage 116 is movable in the three-dimensional direction, and can move in the direction of the optical axis (Z direction) of the projection optical system 110 and within a plane (X-Y plane) perpendicular to the direction of the optical axis. A laser interferometer 118 measures the distance to a moving mirror 117 fixed to the wafer stage 116, thereby detecting the position of the wafer stage 116 on the X-Y plane.

A stage controller 120 under the control of the main controller 103 of the exposure apparatus detects the position of the wafer stage 116 by the laser interferometer 118 and controls a driving unit 119 such as a motor to move the wafer stage 116 to a predetermined position on the X-Y plane.

Reference numeral 121 denotes a floodlight optical system; and 122, a detection optical system. The floodlight optical system 121 and detection optical system 122 constitute a focus plane detection unit. The floodlight optical system 121 projects a plurality of light beams comprising non-exposure light that does not photosensitize the photoresist on the wafer 115. The projected light beams are focused on the wafer 115 and reflected. The light beams reflected by the wafer 115 are incident on the detection optical system 122.

Although not shown, a plurality of position detecting light-receiving elements are positioned in the detection optical system 122 to correspond to the respective reflected light beams. The light-receiving surfaces of the respective position detecting light-receiving elements and the reflection points for the respective light beams on the wafer 115 are almost conjugate through an imaging optical system. A positional shift of the surface of the wafer 115 in the direction of the optical axis of the projection optical system 110 is measured as a positional shift of the incident light beams on the position detecting light-receiving elements in the detection optical system 122.

The model expression of the aberration fluctuation (image characteristics fluctuation) of the projection optical system 110 that occurs upon irradiation with the exposure energy according to this embodiment and a correction coefficient to compensate for the imaging characteristics fluctuation of each exposure condition employed to quantify the model expression will now be explained.

Figure 2:
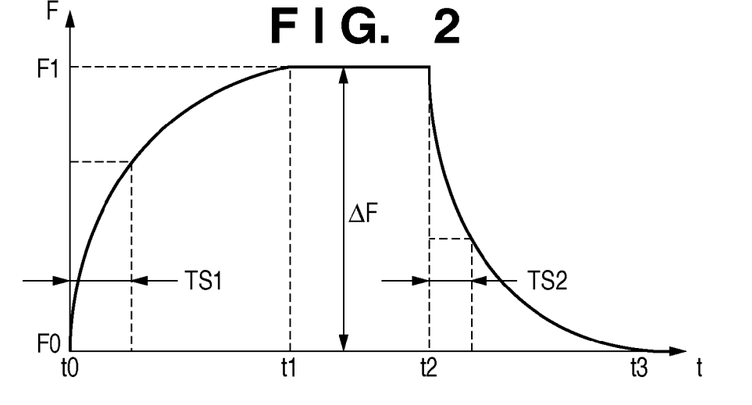
FIG. 2 is a graph showing an example of fluctuation characteristics of aberration of a projection optical system.

FIG. 2 shows an example of a change over time of the aberration of the projection optical system 110 caused by exposure. Note that the axis of the abscissa represents a time t, and the axis of the ordinate represents an aberration amount F of a certain image height of the projection optical system 110. Aberration signifies focus, magnification, distortion aberration, astigmatism aberration, spherical aberration, coma aberration, and the like. ΔF indicates the fluctuation amount of aberration and generally takes a different value for each image height. Assume that the initial value of the aberration amount as the imaging characteristics value of the projection optical system 110 is F0. When the pulse laser source 101 starts exposure of the projection optical system 110 at time t0, the aberration fluctuates as the time passes, and stabilizes at a given aberration amount F1 at time t1. After that, even when the projection optical system 110 with the exposure light, the energy absorbed by the projection optical system 110 is continuously irradiated to generate heat and the thermal energy emitted by the projection optical system 110 reach an equilibrium, so that the aberration amount does not change from F1. When exposure is stopped at time t2, the aberration amount is restored to the initial state as time passes, and reaches the initial aberration amount F0 at time t3.

Time constants TS1 and TS2 in FIG. 2 are equivalent to the time constants on the heat transfer characteristics of the projection optical system 110. The time constants TS1 and TS2 are values unique to each projection optical system 110 and change from one aberration to another. Hence, the time constants TS1 and TS2 are acquired for each apparatus and for each aberration when testing the projection optical system.

A method of calculating the maximum fluctuation amount F1 of the aberration shown in FIG. 2 will now be explained. The maximum fluctuation amount F1 can be expressed as equation (1) using an aberration fluctuation amount K per unit light amount (unit exposure energy) and a parameter Q of the exposure condition (the exposure time, exposure amount, scanning speed, exposure region information, and the like) which determines the actual exposure energy:

$$F1 = K \times Q \quad (1)$$

Assuming that the aberration amount at a given time is $\Delta F_k$, an aberration amount $\Delta F_{k+1}$ obtained by exposure at a time $\Delta t$ since the given time is approximated as:

$$\Delta F_{k+1} = \Delta F_k + F1 \times (1 - \exp(-\Delta t/TS1)) \quad (2)$$

from the maximum fluctuation amount F1 and the time constants TS1 and TS2 stored for each aberration. Similarly, if exposure is not performed for the time $\Delta t$, the aberration amount $\Delta F_{k+1}$ can be approximated as:

$$\Delta F_{k+1} = \Delta F_k \times \exp(-\Delta t/TS2) \quad (3)$$

The curve representing the fluctuation characteristics of the aberration of the projection optical system 110 shown in FIG. 2 is modeled using the functions of the above equations (1), (2), and (3) to predict the fluctuation of the aberration, caused by the exposure heat, of the projection optical system. Note that equations (1), (2), and (3) are merely an example of this embodiment, and the curve may be modeled using other equations.

The fluctuation characteristics model of the aberration of the projection optical system described above includes an exposure model indicating an imaging characteristics fluctuation during irradiation of the projection optical system with the exposure light, and a non-exposure model indicating an imaging characteristics fluctuation in a state in which irradiation is stopped. The exposure model is expressed by equation (2), and the non-exposure model is expressed by equation (3).

When calculating the maximum fluctuation amount F1 employed in the above equation (2), a correction coefficient to be described later is used. The correction coefficient is calculated for each aberration.

The parameter Q of equation (1) will now be explained. This parameter includes any one of, for example, the exposure time, exposure amount, and scanning speed. Combination of the parameter Q with the correction coefficient described above allows calculation of the maximum fluctuation amount F1.

The correction coefficient must be calculated for each exposure condition. This is because when the exposure condition changes, the energy density distribution of light which is incident on the projection optical system 110 changes, and accordingly the aberration fluctuation amount of the projection optical system and its image height dependency change. The exposure condition indicates the effective light source shape, the mask pattern, and the region where the mask is irradiated.

Figure 3:
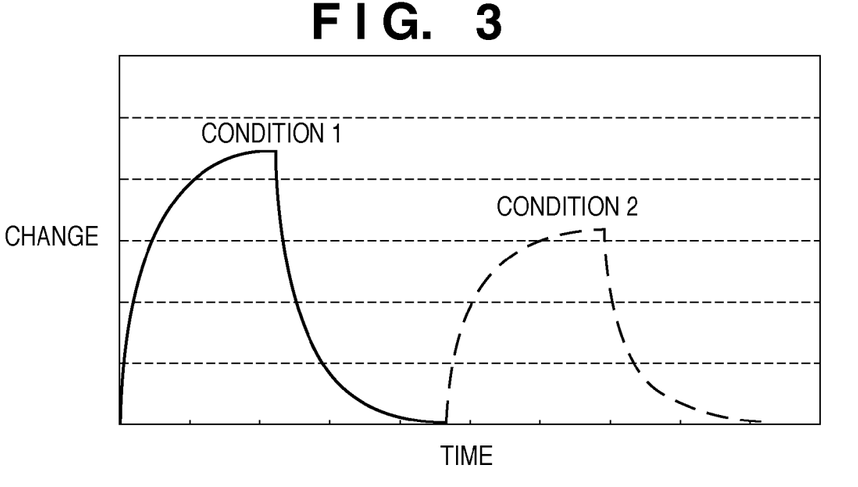
FIG. 3 is a graph showing an aberration change in the measurement process according to a prior art.

FIG. 3 shows an example of an aberration change in the conventional measurement process. When calculating the correction coefficient for each different exposure condition, to calculate the correction coefficient accurately by eliminating the influence of the residual aberration that exists under a different exposure condition, standing/cooling is performed until the aberration almost disappears. Hence, when many exposure conditions exist, calculation takes much time, as described above.

Figure 4:
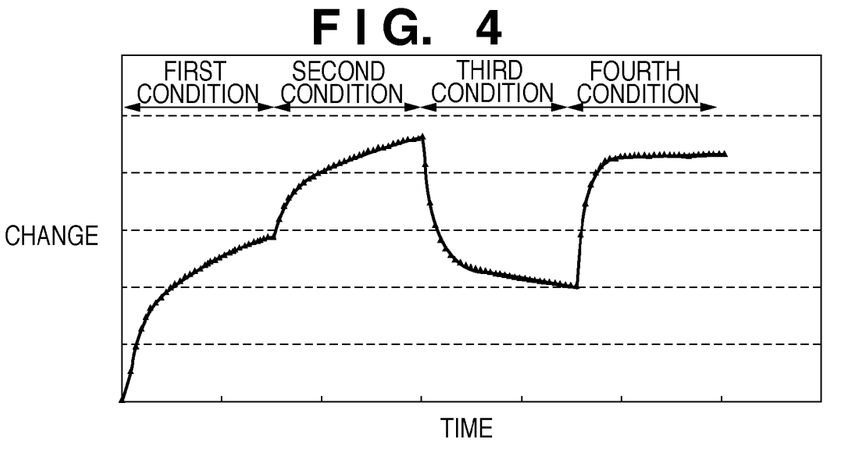
FIG. 4 is a graph showing an aberration change in the measurement process of the embodiment in FIG. 1.

FIG. 4 shows an example of an aberration change in the measurement process according to this embodiment. In this embodiment, even when the exposure condition changes, exposure evaluation can be performed near continuously regardless of whether or not the aberration from the previous condition remains, so that the correction coefficient for each exposure condition can be calculated by a process to be explained hereinafter.

First, the measurement process (first process) of performing exposure under each exposure condition and measuring a discrete aberration in the imaging characteristics fluctuation predicting method of this embodiment will be explained. In this measurement process, the projection optical system is irradiated with exposure light under the first exposure condition to measure the first imaging characteristics fluctuation of the projection optical system. Then, after irradiation is stopped, before the imaging characteristic value is restored to the initial value F0 obtained at the start of irradiation, the projection optical system is irradiated with the exposure light under the second exposure condition to measure the second imaging characteristics fluctuation of the projection optical system.

Figure 5:
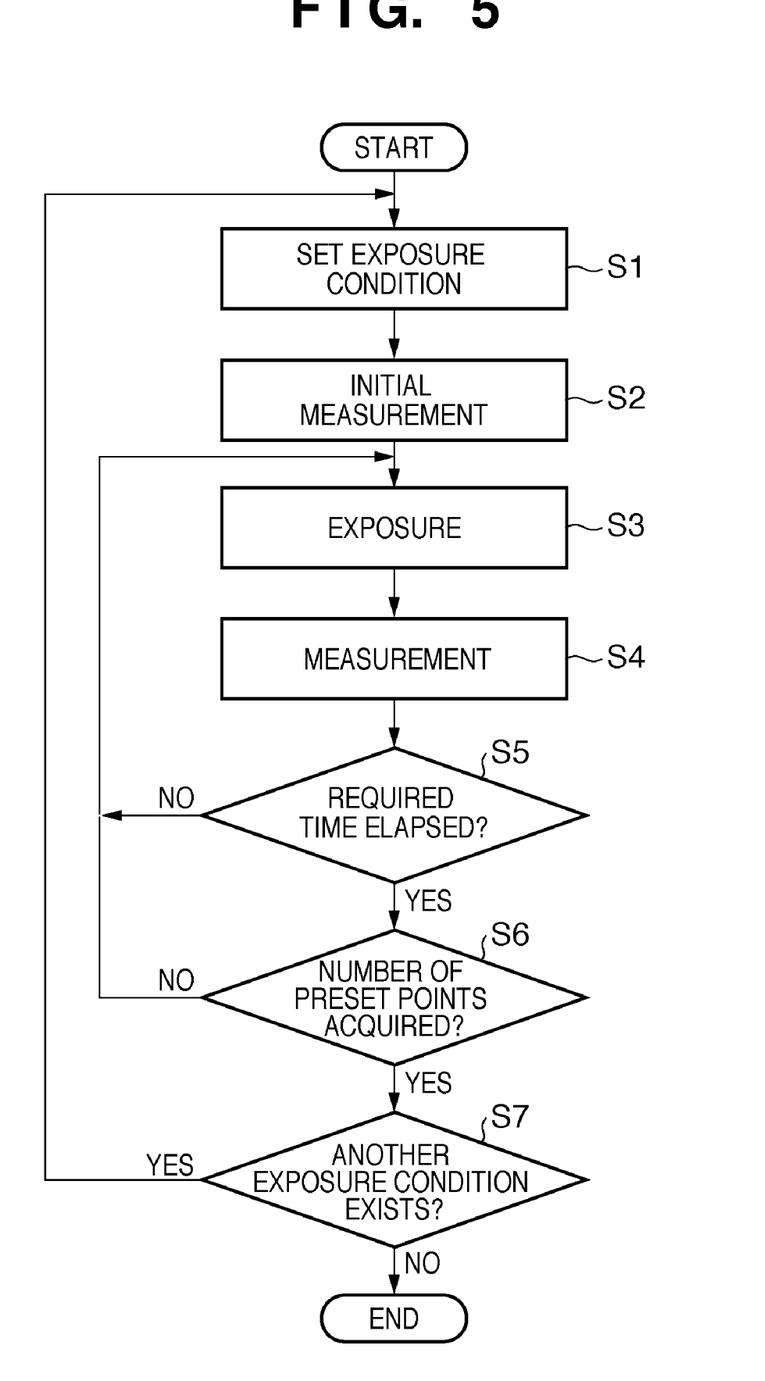
FIG. 5 is a flowchart showing the content of the measurement process of the embodiment in FIG. 1.

FIG. 5 is a flowchart showing the content of the measurement process of this embodiment. First, in step S1, the exposure condition under which the coefficient is to be obtained is set as the first exposure condition. The exposure condition includes the effective light source, mask, exposure region, and the like. After that, initial measurement is performed in step S2.

In steps S3 and S4, measurement and exposure are repeated under the preset exposure condition to measure a plurality of aberrations which are discrete in time, and obtained measurement data is stored in the storage. The measurement data is at least one of focus distortion, magnification, distortion aberration, astigmatism aberration, spherical aberration, coma aberration, and wavefront aberration.

More specifically, in steps S5 and S6, whether or not a predetermined required time has elapsed and whether or not a predetermined number of necessary measurement points have been acquired is checked. If NO in step S5 or S6, the process returns to step S3, and exposure and measurement are repeated. If YES in steps S5 and S6, the measurement process of measuring the first imaging characteristics fluctuation under the first exposure condition set in step S1 is ended. When evaluating a plurality of aberrations simultaneously, the same determination is made for each aberration. The measurement interval, the required time, and the number of necessary measurement points change depending on the aberration to be corrected and the apparatus.

In step S7, it is checked whether or not another exposure condition under which the correction coefficient is to be calculated exists. If YES in step 7, steps S1 to S6 described above are repeated. If, for example, the second exposure condition exists, it is set and the second imaging characteristics fluctuation is measured. At this time, a non-exposure time corresponding to the time constant unique to the apparatus may be reserved in the exposure interval between the new exposure condition (second exposure condition) and the previous exposure condition (first exposure condition). Then, the influence of an aberration component that changes rapidly can be eliminated before the next exposure. This is advantageous in terms of the accuracy of correction coefficient calculation.

A calculation process (second process) for calculating an approximate expression of the imaging characteristics fluctuation measured in the measurement process will now be explained based on the imaging characteristics model.

Figure 6:
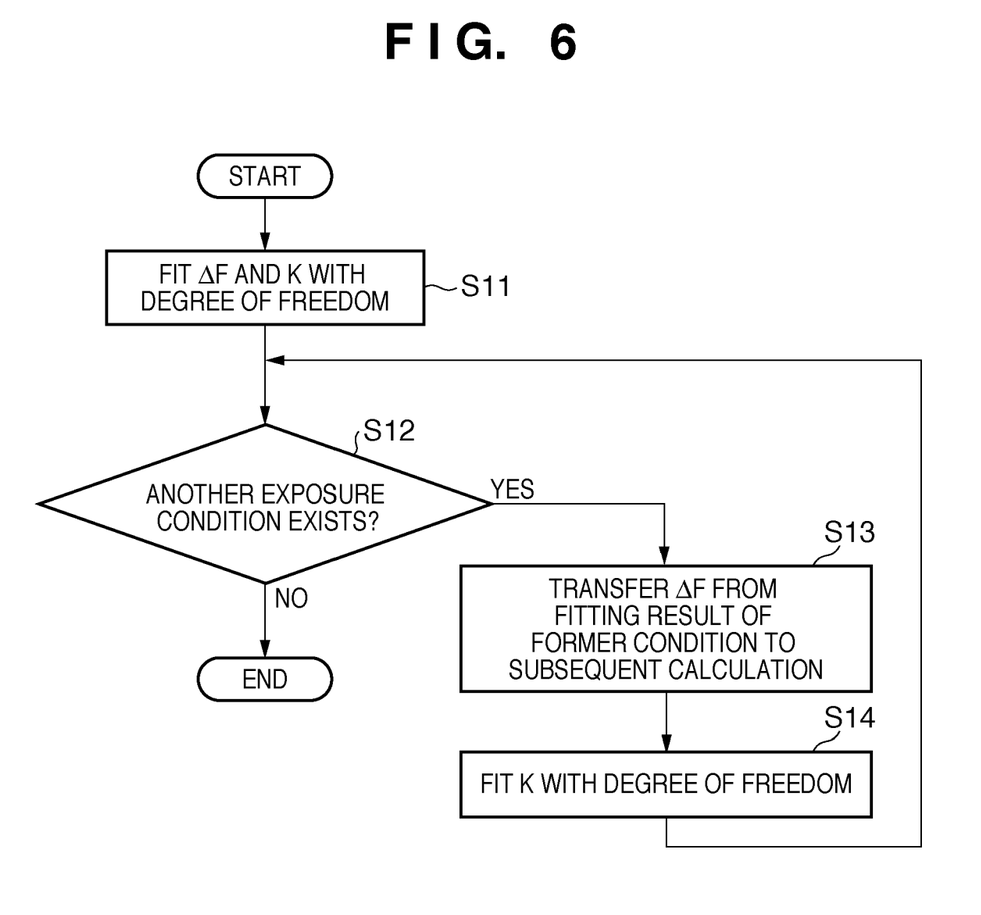
FIG. 6 is a flowchart showing the content of a calculation process of the embodiment in FIG. 1.

FIG. 6 is a flowchart showing the content of the calculation process. First, in step S11, the approximate expression (optimum correction model) of the first imaging characteristics fluctuation is calculated based on the exposure model. More specifically, the initial (at the start of irradiation) residual aberration amount $\Delta F$ and the correction coefficient are calculated based on the measurement data under the first exposure condition obtained by the above measurement process, the time when the measurement data is acquired, and exposure information obtained when the data is acquired. The initial residual aberration amount $\Delta F$ and the correction coefficient are calculated such that the residual between the predetermined correction model and the discrete measurement data is minimized.

Figure 7:
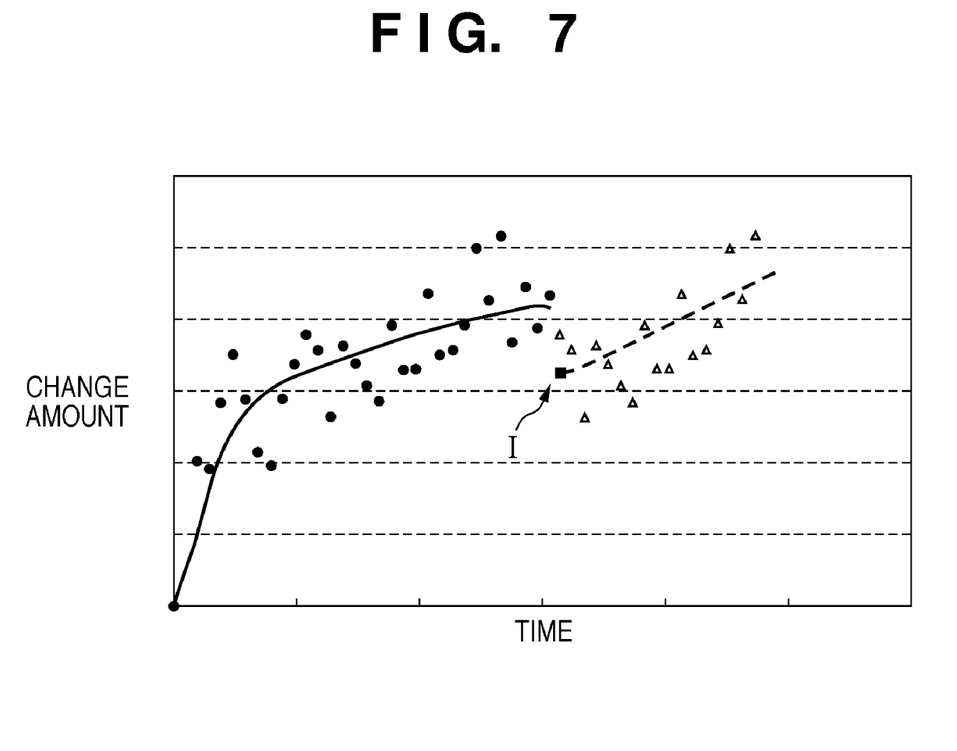
FIG. 7 is a graph for explaining a process for obtaining the initial residual aberration amount of the embodiment in FIG. 1.

In step S12, whether or not another exposure condition (second exposure condition) exists is checked. If YES in step S12, the process advances to step S13. In step S13, the final residual aberration amount (final imaging characteristics value) obtained in step S11 by the approximate expression and the time present until next exposure are applied to the non-exposure model of equation (3) to obtain the initial residual aberration amount $\Delta F$ ((1) in FIG. 7) under the next exposure condition. In step S14, the approximate expression of the second imaging characteristics fluctuation measured in the measurement process is calculated based on the exposure model to which the initial residual aberration amount $\Delta F$ is applied. For example, the correction coefficient is calculated based on the time-discrete aberration change data under the next exposure condition, which is obtained in the measurement process, and exposure information provided between data, such that the residue between the predetermined correction model and the measurement data is minimized.

After that, the process returns to step S12. If still another exposure condition (third exposure condition) exists, the correction coefficient is calculated in steps S13 and S14 in accordance with the order of actual exposure. The correction coefficient of the imaging characteristics of the projection optical system is calculated for each aberration to be predicted.

Although this embodiment has one model, this embodiment may have a plurality of models, or may employ another type of model. According to the above example, in step S13, the initial residual aberration amount $\Delta F$ is obtained from an optimum correction model, the final residual aberration amount obtained from the correction coefficient, and the time that elapses until next exposure by using the non-exposure model of equation (3). If the measurement accuracy is sufficiently high, the initial measurement value under the next exposure condition may be employed.

Figure 8:
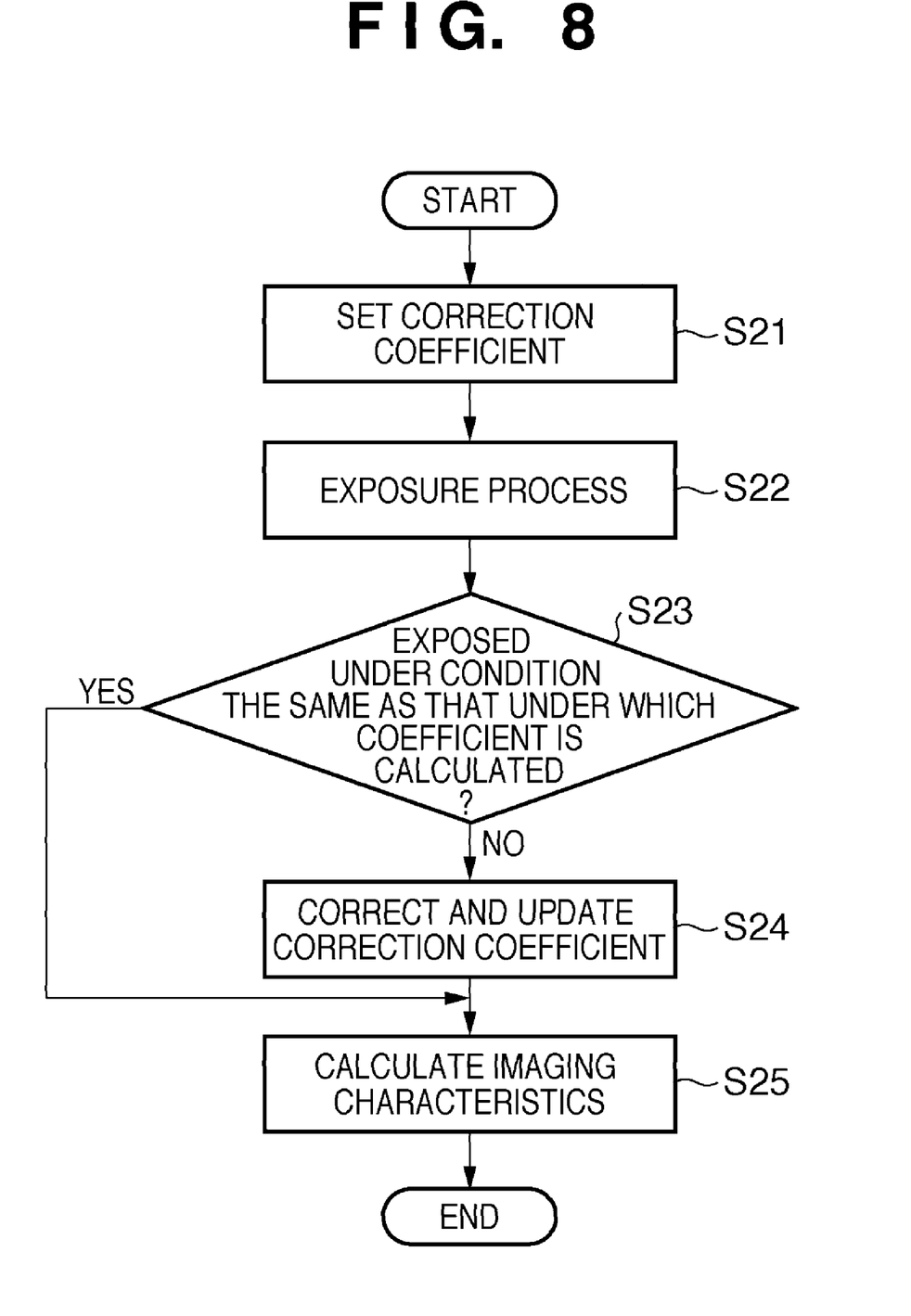
FIG. 8 is a flowchart showing an exposure process of the embodiment in FIG. 1.

The exposure flowchart in projection onto the wafer will be summarized with reference to the flowchart in FIG. 8. A correction coefficient that matches the exposure condition is read out in step S21, and the exposure process is performed in step S22.

In step S23, it is checked whether or not the exposure condition (exposure amount, exposure region, and the like) under which the correction coefficient is calculated is equal to that under which actual exposure takes place. If the condition changes, a prediction error occurs in the aberration equation. Hence, the correction coefficient is corrected and updated in step S24 to compensate for the error. In step S25, the aberration (imaging characteristics) is calculated using the correction coefficient.

The maximum fluctuation amount F1 of the aberration for each image height is calculated from the correction coefficient calculated for each exposure condition and the condition Q under which exposure is actually performed. After calculating the maximum fluctuation amount F1, the heating and cooling calculations shown in the above equations (2) and (3) are performed, so that the time characteristics of the aberration fluctuation amount ΔF can be predicted.

A method of correcting the aberration fluctuation amount ΔF will now be explained.

Each aberration fluctuation amount is predicted based on the correction coefficient calculated in the above calculation process (second step) and the actual exposure optical energy condition, and the position of the correction system (at least one of the projection optical system, reticle stage, and wafer stage) is calculated to correct the predicted aberration fluctuation amount.

Although not shown, if a prediction model for each image height is used, an aberration fluctuation amount at an arbitrary image height can be predicted, so that the correction system position can be calculated.

When calculating the correction system position immediately before exposure, it is calculated from an atmospheric pressure sensor output to include the influence that the atmospheric pressure of an environmental gas surrounding the projection optical system imposes on the imaging projection system, and the offset amount set as the exposure parameter or apparatus parameter.

A method of driving the correction system to the calculated position will now be explained. An optical driving element which drives an optical element such as a lens or mirror accurately in a desired direction is mounted in the projection optical system of this embodiment in order to form the image of the mask pattern more accurately.

Figure 9A:
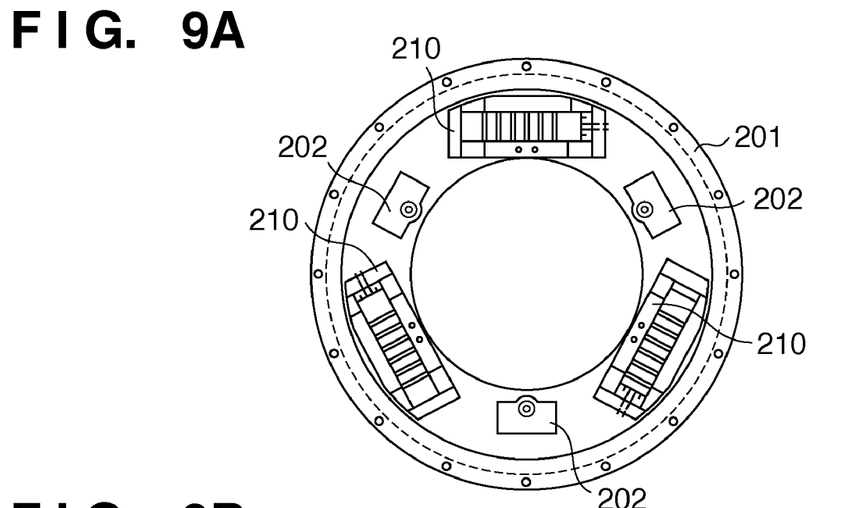
FIGS. 9A to 9C are views showing a driving mechanism for the projection optical system of the embodiment in FIG. 1.
Figure 9B:
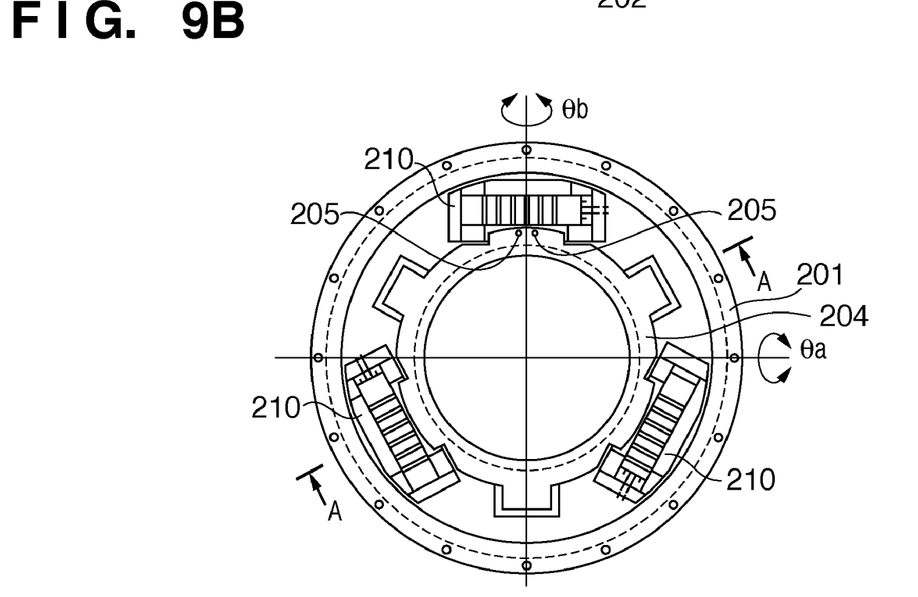
Figure 9C:
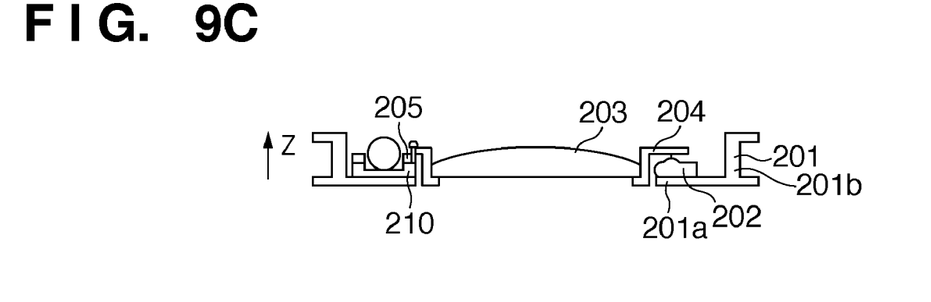

FIGS. 9A to 9C are views showing a driving mechanism for the projection optical system of the embodiment. This driving mechanism employs the driving system disclosed in Japanese Patent Application No. 2006-028789. Hence, the optical element can be driven in a desired direction.

FIG. 9A is a plan view from which a lens and lens frame are removed, FIG. 9B is a plan view with the lens and lens frame mounted, and FIG. 9C is a sectional view taken along the line A-A of FIG. 9B. A stationary lens barrel 201 has optical element drivers 210, a bottom surface flat portion 201a where the lens position detecting portion is to be fixed, and a side wall cylindrical portion 201b to connect the stationary lens barrel 201 to adjacent upper and lower, other lens units.

The optical element drivers 210 comprise three sets of identical driving mechanisms and are set on the bottom surface flat portion 201a of the stationary lens barrel 201. Lens position detection units 202 are units that detect displacements of the lens frame in the direction of the optical axis and in the radial direction perpendicular to the optical axis, and comprise each an interference length measurement unit employing a semiconductor laser, an electrostatic capacitance displacement meter, a linear encoder, a differential transformer type displacement gauge, or the like where necessary in accordance with the requested accuracy.

FIG. 9B shows a state in which the lens and lens frame are mounted. A lens frame 204 for storing a lens 203 is provided with flanges as flange-shape projections at six locations on the upper surface. Of the six flanges, three are fastened to the displacement output portions of the optical element drivers 210 with lens frame attaching screws 205.

An explanation will be made with reference to FIG. 9C. Laser interferometer type displacement sensors are used as lens position detection units 202. For example, detecting laser beams are projected in the direction of the optical axis and the radial direction of the lens 203, and displacements of the three portions (near flange portions) of the lens frame 204 each in the direction of the optical axis (Z direction) and in the radial direction are detected from the interference information of the reflected light. In the above arrangement, when the three sets of optical element drivers 210 are driven by the same amount, the lens 203 can be translated in the direction of the optical axis, that is, in the Z-direction axis shown in FIG. 9C.

When the driving amounts of the three sets of optical element drivers 210 are provided with predetermined differences, tilt driving in directions θa and θb shown in FIG. 9B becomes possible. At this time, when the outputs from the lens position detection units 202 in the direction of the optical axis are fed back, the translating amount and tilt driving amount of the lens 203 can be controlled accurately. Also, when the outputs from the lens position detection units 202 in the radial direction are monitored, the amount of shift of the image accompanying parallel eccentricity in the plane perpendicular to the optical axis of the lens 203 can be calculated.

When these calculation results are added to the driving amount of, for example, the wafer stage, an alignment error of the reticle image accompanying eccentricity of the lens can be eliminated.

The driving mechanisms of the projection optical system described above tilt the optical element, and drive it in the Z direction to correct the current aberration. Hence, for example, a fluctuation in aberration that occurs asymmetrically with respect to the optical axis can be corrected.

When correcting, for example, the focus, not only the projection optical system but also the reticle stage where the reticle is placed, or the wafer stage where the wafer is placed may be driven in the Z direction or tilted so that their positions and postures are corrected.

A device manufacturing method according to a preferred embodiment of the present invention is suitable to the manufacture of a device such as a semiconductor device, a liquid crystal device, and the like. This device manufacturing method can include a step of exposing a substrate coated with a photosensitive agent using the exposure apparatus described above, a step of developing the substrate exposed in the exposure step, and other known steps of processing the developed substrate to manufacture a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-194793, filed Jul. 26, 2007, which is hereby incorporated by reference herein in its entirety.

What is claimed is:

1. A method for predicting fluctuation in imaging characteristics of a projection optical system in an exposure apparatus which projects a pattern formed on a reticle onto a wafer through the projection optical system, the method comprising:

a measurement step of irradiating the projection optical system with exposure light under a first exposure condition to measure first imaging characteristics fluctuation of the projection optical system and, before an imaging characteristics value is restored to an initial value at the start of irradiation after irradiation is stopped, irradiating the projection optical system with the exposure light under a second exposure condition to measure second imaging characteristics fluctuation of the projection optical system; and a calculation step, performed by a calculation unit, of calculating approximate expressions of the first and second imaging characteristics fluctuations measured in the measurement step based on an imaging characteristics model, wherein the imaging characteristics model includes an exposure model indicating imaging characteristics fluctuation during irradiation of the projection optical system with the exposure light, and a non-exposure model indicating imaging characteristics fluctuation in a state in which irradiation is stopped, and said calculation step, performed by the calculation unit, comprises the steps of:

calculating the approximate expression of the first imaging characteristics fluctuation based on the exposure model, applying, to the non-exposure model, a final imaging characteristics value obtained by the approximate expression of the first imaging characteristics fluctuation, and a time that elapses from irradiation of the projection optical system with the exposure light under the first exposure condition is stopped until irradiation of the projection optical system with the exposure light under the second exposure condition is started, thus calculating an initial value of the second imaging characteristics fluctuation, and calculating the approximate expression of the second imaging characteristics fluctuation measured in said measurement step based on the exposure model to which the initial value of the second imaging characteristics fluctuation is applied.

2. The method according to claim 1, wherein the imaging characteristics fluctuation includes at least one of a fluctuation of focus, a fluctuation of magnification, a fluctuation of distortion aberration, a fluctuation of astigmatism aberration, a fluctuation of spherical aberration, and a fluctuation of coma aberration.

3. The method according to claim 1, wherein the first and second exposure conditions are different with respect to at least one of an effective light source, a mask, and an exposure region.

4. An exposure apparatus which illuminates a reticle placed on a reticle stage by an illumination optical system to project a pattern formed on the reticle onto a wafer placed on a wafer stage through a projection optical system, the apparatus comprising:

a measurement unit configured to irradiate the projection optical system with exposure light under a first exposure condition to measure first imaging characteristics fluctuation of the projection optical system and, before an imaging characteristics value is restored to an initial value at the start of irradiation after irradiation is stopped, irradiate the projection optical system with the exposure light under a second exposure condition to measure second imaging characteristics fluctuation of the projection optical system;

a calculation unit configured to calculate approximate expressions of the first and second imaging characteristics fluctuations measured by said measurement unit based on an imaging characteristic model; and a control unit configured to control a position and a posture of at least one of the projection optical system, the reticle stage, and the wafer stage, when projecting the pattern onto the wafer, based on the approximate expressions of the first and second imaging characteristics fluctuations calculated by the calculation unit, wherein the imaging characteristics model includes an exposure model indicating imaging characteristics fluctuation during irradiation of the projection optical system with the exposure light, and a non-exposure model indicating imaging characteristics fluctuation in a state in which irradiation is stopped, and said calculation unit is configured to:

calculate the approximate expression of the first imaging characteristics fluctuation based on the exposure model, apply, to the non-exposure model, a final imaging characteristics value obtained by the approximate expression of the first imaging characteristics fluctuation, and a time that elapses from irradiation of the projection optical system with the exposure light under the first exposure condition is stopped until irradiation of the projection optical system with the exposure light under the second exposure condition is started, to calculate an initial value of the second imaging characteristics fluctuation, and calculate the approximate expression of the second imaging characteristics fluctuation measured in said measurement unit based on the exposure model to which the initial value of the second imaging characteristics fluctuation is applied.

5. A device manufacturing method comprising the steps of:

exposing a wafer using an exposure apparatus according to claim 4; and developing the wafer.

* * * * *